United States Patent [19]
White et al.

[11] Patent Number: 5,585,755
[45] Date of Patent: Dec. 17, 1996

[54] AUDIO DIFFERENTIAL BUS RECEIVER FOR AUDIO/VIDEO INTERCONNECTION

[75] Inventors: Charles M. White, Noblesville; Thomas D. Gurley, Indianapolis, both of Ind.

[73] Assignee: Thomson Consumer Electronics, Inc., Indianapolis, Ind.

[21] Appl. No.: 517,174

[22] Filed: Aug. 21, 1995

[51] Int. Cl.⁶ ............................................ H03K 17/62
[52] U.S. Cl. ................................. 327/333; 327/411
[58] Field of Search ............................. 327/333, 411

[56] References Cited

U.S. PATENT DOCUMENTS

| | | | |
|---|---|---|---|
| 4,087,643 | 5/1978 | Joslow et al. | 179/15 AL |
| 4,575,759 | 3/1986 | Griepentrog et al. | 358/181 |
| 4,581,645 | 4/1986 | Beyers, Jr. | 358/181 |
| 4,647,973 | 3/1987 | Diess | 358/181 |

*Primary Examiner*—Margaret Rose Wambach
*Attorney, Agent, or Firm*—Joseph S. Tripoli; Peter M. Emanuel; Richard G. Coalter

[57] ABSTRACT

Audio bus receiver includes a pair of bipolar transistors each having a base coupled via a respective resistor to a respective bus receiver input terminal, each having an emitter that is diode coupled to a respective current source and each having a collector coupled via a respective load resistor to a source of reference potential. The emitters are coupled together via a gain control resistor and the collectors are coupled to an output terminal via a differential amplifier. Advantageously, the receiver avoids loading the bus under power-down conditions without requiring the use of standby power supplies. Additionally, high common mode rejection is achieved without need for precision matching of components and only a single supply voltage is required for operation.

16 Claims, 2 Drawing Sheets

5,585,755

AUDIO DIFFERENTIAL BUS RECEIVER FOR AUDIO/VIDEO INTERCONNECTION

FIELD OF THE INVENTION

This invention relates to audio/video interconnection systems generally and particularly to audio differential bus receivers suitable for use in such systems.

BACKGROUND OF THE INVENTION

Bus oriented bi-directional audio/video interconnection systems are known and used, for example, for interconnecting component audio/video apparatus such as video tape recorders, video disc players, television tuners, video cameras, video monitors and the like. In typical systems, a common bus containing control, audio and video signals is "daisy chained" between various equipment and driven by tri-state drivers so that the bus may be "shared", so to speak, by all of the connected audio/video units. Such a system is described, for example, by Beyers, Jr. in U.S. Pat. No. 4,581,645 entitled DISTRIBUTED SWITCHED COMPONENT AUDIO/VIDEO SYSTEM which issued Apr. 8, 1986.

More recently, the U.S. Electrical Industries Association (EIA) has considered standardization of audio, video and control interconnections for television apparatus. One standard under consideration proposes audio and video interconnection using twisted pair cables driven by tri-state balanced line drivers. Devices are connected in "daisy chain" fashion to the bus which is terminated with 120 Ohm loads at the first and last devices and with intermediate devices having relatively high impedance inputs connected for bridging operation. An example of such a system is described by White et al. in allowed U.S. application Ser. No. 08/294,146 entitled TRI-STATE VIDEO DIFFERENTIAL DRIVER filed 8 Aug. 1994.

Significant parameters of the audio bus receiver portion of the proposed standard includes (i) a bus audio differential signal level of 2.0 volts RMS (plus or minus 20%), (ii) a bus receiver common-mode range of 5.0 volts (plus or minus 2.0 volts DC), (iii) a minimum input impedance (with the receiver device on or off) of 3K Ohms differential, DC-20 kHz and 1.5K Ohms common mode and (iv) a common mode rejection ratio of 60 dB.

To meet these requirements one might consider the use of conventional techniques such as providing a stand-by power supply or precision attenuation networks (to provide the desired bus isolation under power-down conditions) and selecting feedback controlled operational amplifiers to meet the gain and common mode requirements and to provide single-ended to differential conversion. However, combining such conventional techniques can result an overall receiver design that may be prohibitively costly and overly complex for use in mass produced consumer products such as VCR's or television receivers.

SUMMARY OF THE INVENTION

A need exists for a simplified bus receiver which does not require the use of stand-by supplies, precision networks or feedback controlled operational amplifiers. The present invention is directed to meeting those needs.

Differential to single-ended audio bus receiver apparatus, embodying the invention, comprises a pair of bipolar transistors each having a base coupled via a respective resistor to a respective bus receiver input terminal, each having an emitter that is diode coupled to a respective current source and each having a collector coupled via a respective load resistor to a source of reference potential. The emitters are coupled together via a gain control resistor and the collectors are coupled to an output terminal via a differential amplifier.

BRIEF DESCRIPTION OF THE DRAWING

The foregoing and further features of the invention are shown in the accompanying drawing wherein like elements are denoted by like reference designators and in which.

DETAILED DESCRIPTION

Figure 1:
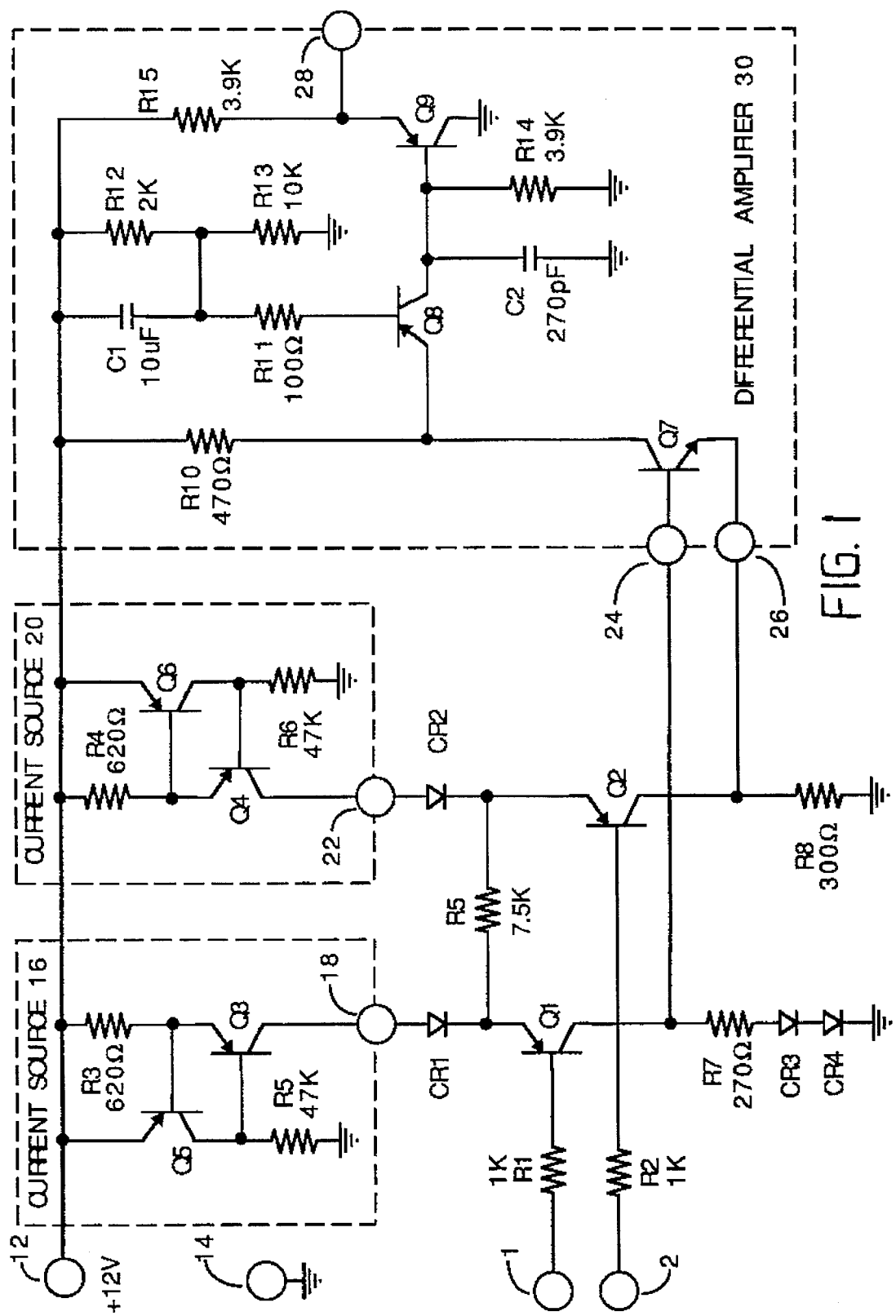
FIG. 1 is a detailed schematic diagram of a differential audio bus receiver embodying the invention.

The bus receiver of FIG. 1 comprises first and second PNP transistors, Q1 and Q2. First and second input resistors, R1 and R2, are connected between respective first and second signal input terminals, 1 and 2, and respective base electrodes of the first and second PNP transistors. First and second constant current sources (16 and 20, each outlined in phantom) are provided having respective outputs, 18 and 22, coupled via respective ones of first and second PN diodes, CR1 and CR2 to respective emitter electrodes of the first and second PNP transistors, Q1 and Q2. First and second collector load resistors, R7 and R8 are coupled between respective collector electrodes of the first and second PNP transistors, Q1 and Q2, and a source of reference potential (14) herein shown as being a ground connection. An emitter load resistor R5 is coupled between the emitter electrodes of the first and second transistors Q1 and Q2.

A differential amplifier is provided (30, outlined in phantom) having first and second inputs (24 and 26, respectively) connected to respective ones of the collector electrodes of the first and second transistors (Q1 and Q2) for providing a single-ended output signal at the differential amplifier output terminal 28.

For differential amplifiers of the type having a relatively low input offset voltage, one would select the values of the collector load resistors R7 and R8 of the input transistors Q1 and Q2 to be substantially equal and no offset voltage need be introduced in the collector load path of the input transistors Q1 and Q2.

The particular differential amplifier shown for use as amplifier 30 comprises a single bipolar transistor (Q7) and requires an input voltage offset. The DC offset is provided by the connections of two PN diodes, CR3 and CR4, connected in series with the load resistor R7 of input transistor Q1. Resistor R7 is also selected to provide slightly less resistance than the collector load resistor R8. These adjustments compensate for the input offset of differential amplifier 30 which utilizes a single NPN transistor for providing differential to single-ended (i.e., non-differential) conversion.

In more detail, it will be noted that differential amplifier 30 includes no overall feedback path thus ensuring unconditional stability. As noted above, to use a single transistor (e.g., Q7) as a differential to single-ended converter, a DC offset is added to the collector load of the input stage. In this example of the invention, the DC offset is provided by the series connected diodes CR3 and CR4 in the Q1 collector load. Accordingly, the input transistor Q7 of amplifier 30 is connected at the base thereof to the collector of transistor Q1 (which has the more positive quiescent load voltage) and is connected at the emitter thereof to the collector of input transistor Q2 (which has a less positive quiescent load voltage).

The remaining elements of differential amplifier 30 comprise an emitter follower output stage (PNP transistor Q9) and a common base amplifier stage (PNP transistor Q8) for coupling the collector electrode of the differential amplifier input transistor Q7 to the input of the emitter follower output stage.

The common base stage comprises PNP transistor Q8 the base electrode of which is connected to a source of positive reference voltage provided by a voltage divider comprising resistors R12 and R13 coupled between the supply terminal 12 and ground. This reference voltage, at the common junction of the two resistors R12 and R13 is filtered or smoothed by a capacitor C1 coupled between the resistor junction and the supply terminal and is applied to the base of transistor Q8. The emitter of the common base connected transistor Q8 is connected to the collector of the differential amplifier input transistor Q7 thereby regulating the collector voltage of the input transistor at a constant value with operating current for both transistors being supplied by a resistor R10 (connected between the input of the common base stage and the supply terminal 12). The collector voltage of transistor Q7, being regulated by the common base stage (Q2) is thus equal to the output of the potential divider less the base emitter voltage drop of the common base stage Q8.

The common base stage output voltage is developed across load resistor R14 coupled between the collector of Q8 and ground. Capacitor C2, in parallel with the common base stage load resistor R14 functions as a low pass filter which, for the element values shown, has a time constant of about 1 micro-second thus limiting the high frequency response to about 160 kHz. This frequency is well above the audio band but sufficiently low as to reduce high frequency video cross talk and noise into the audio channel.

The overall gain for the differential input stage (Q1,Q2) and the differential amplifier 30 is determined by the value of the emitter load resistor R5 of the differential input stage and the value of the collector load resistor R14 of the differential output stage. The net gain is approximately equal to the ratio of R14/R5.

Figure 2:
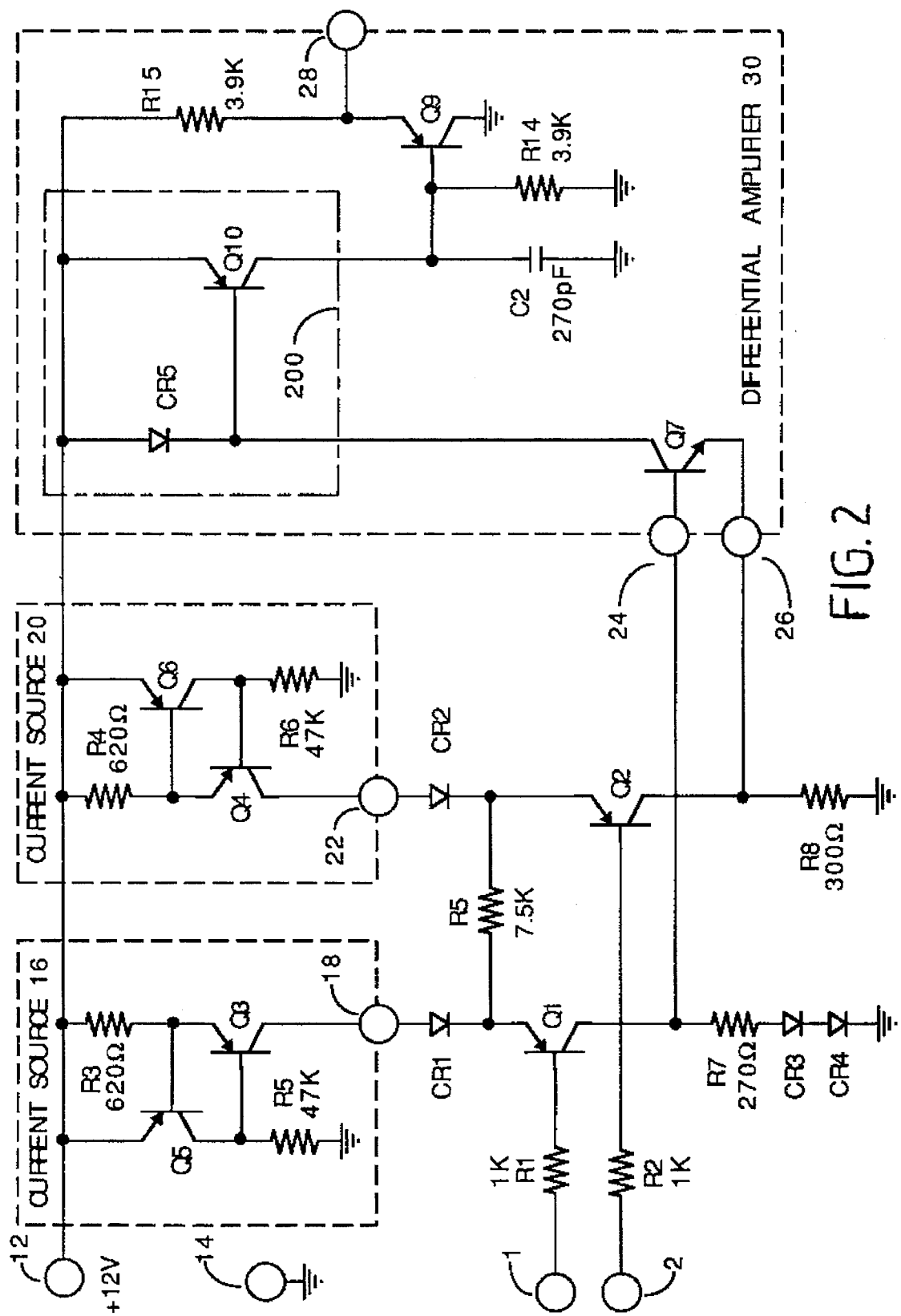
FIG. 2 illustrates a modification of the differential audio bus receiver of FIG. 1.

One may consider the common base stage (Q8, R10 and the base bias network R11–R13 and C1) as used in the present invention as performing the function of what is commonly called a "current mirror amplifier" in that it "mirrors" or "reflects" the collector current of transistor Q7 from the positive supply rail. In other words, in this specific application a current mirror amplifier is a suitable alternative for the common base amplifier stage shown. As shown in FIG. 2, one may, if desired, replace the common base stage (Q8) with a current mirror amplifier (200) by removing transistor Q8 and its associated base bias network and connecting the "mirror" input to the collector of transistor Q7 and connecting the mirror output to the load resistor R14.

In FIG. 2 current mirror amplifier 200 (outlined in phantom) comprising a diode CR5 and a PNP transistor Q10. The diode is connected at the anode thereof to the supply terminal 12 and at the cathode thereof to the collector of transistor Q7 and to the base of transistor Q10. The emitter and collector electrodes of transistor Q10 are connected, respectively, to the supply terminal 12 and to the load resistor R14. In operation, diode CR5 biases transistor Q10 to supply a collector output current to the load resistor R14 that is proportional to the collector current supplied to the current mirror input from the transistor Q7. Aside from this change, the overall operation is as previously described for the common base stage.

Considering now the emitter follower output stage of differential amplifier 30, this stage comprises PNP transistor Q9 coupled at the base thereof to the output of the common base stage (collector of Q8), coupled at the collector thereof to the source of reference potential 14 (i.e., ground) and coupled at the emitter there to the supply terminal 12 via an emitter load resistor R15 and coupled to the differential amplifier output terminal 28.

The current source 16 is a constant current source employing two PNP transistors Q3 and Q5 to achieve precise regulation which is essentially independent of voltage variations at the regulator output terminal 18. Specifically, in current source 16 the supply terminal 12 is coupled directly to the emitter of transistor Q5 and via resistor R3 to the base of transistor Q5 and the emitter of transistor Q3. The base of transistor Q3 and the collector of transistor Q5 are both coupled to ground (14) via a resistor R5 and output current developed at the collector of transistor Q3 is supplied to output terminal 18. The output current is approximately equal to the Vbe of transistor Q5 divided by the value of resistor R3 which, for the illustrative values shown, is about one milli-Ampere. Resistor R5 samples the collector current of transistor Q5 and generates a feedback voltage for transistor Q3 that tends to turn transistor Q3 off if the current through R3 increases relative to the nominal value of one mA. Conversely, if the current through R3 were to decrease below the nominal value, the reduced voltage across resistor R5 would tend to drive transistor Q3 to conduct more current thus counteracting any tendency for the output current delivered to terminal 18 from varying. Current source 20 is identical to current source 16 (resistors R4 and R6 and transistors Q6 and Q4 are connected as the corresponding elements R3, R5, Q5, Q3) and so the description will not be repeated.

In operation, the differential bus receiver of FIGS. 1 and 2 achieves "Off State" isolation from the bus connected to inputs 1 and 2 when the supply voltage is turned off (i.e., terminal 12 voltage reduced to zero) by the characteristics of the collector/base junctions of Q1 and Q2 and the action of diodes CR1 and CR2. With "+V" at ground or at a low potential and with a positive common mode voltage at the inputs 1 and 2, the diodes CR1 and CR2 are reverse biased and do not conduct thereby isolating the bus from ground. With no emitter current in Q1 and Q2 and so long as the common mode voltage is not negative, then both the bases and the collectors of Q1 and Q2 do not conduct. Thus, there is no loading of the input signals under power off conditions. With the power on, the input impedance is approximately R5 times the beta of transistors Q1 and Q2 which is a very high value. The input resistors R1 and R2 contribute very little to the actual input impedance since they are much lower than the R5 beta product but they do provide a measure of protection for the amplifier input.

It may be noted that if the maximum amplitude of the common mode voltage is less than the base to emitter breakdown voltage of transistors Q1 and Q2, then the diodes CR1 and CR2 are not needed and can be eliminated, their action being duplicated by the base/emitter junctions of transistors Q1 and Q2. Also, if the maximum differential voltage across the input terminals 1 and 2 is greater than the base to emitter breakdown voltage of Q1 and Q2, the resistor R5 should be moved to the anodes of diodes CR1 and CR1 instead of the cathodes as shown. However, for maximum circuit linearity the connection of resistor R4 to the cathodes (i.e., the emitters of transistors Q1 and Q2 is preferred.

A special consideration of the values of the collector load impedances (R7,CR3,CR4 and R8) of transistors Q1 and Q2 and the characteristics of amplifier 30 is that a minimal voltage be produced across resistors R7 and R8 relative to ground in order to preserve the common mode range of the circuit. Alternatively, such is not needed if a negative supply were utilized, as the collector loads could be returned to the negative supply and a conventional operational amplifier could be used for the differential amplifier 30. However, as previously explained, for mass produced consumer products such as television receivers or VCR's, single-supply operation, rather than split-supply operation, is preferred.

Considering now the effect of the DC offsetting diodes CR3 and CR4, the differential current gains for the collector load of transistors Q1 and Q2 can be made substantially equal by selecting the net resistive impedance of the Q1 load (i.e., CR3, CR4 plus R7) substantially equal to the value the Q2 load (i.e., resistor R8). The diodes CR3 and CR4 are included for properly DC biasing (offsetting) the differential amplifier transistor Q7. One of the diodes acts to approximately cancel the Vbe of transistor Q7. The other diode acts as a DC "battery" so that its potential plus the DC voltage across resistor R7 acts to set the voltage at the emitter of transistor Q7 and thus establishes the bias condition of transistor Q7. This use of a diode to act as a DC "battery" is preferred over using a bias resistor from the positive supply 12 to the base of transistor Q7 because it does not introduce a power supply related dependence on the output which would tend to reduce the power supply rejection ratio of the overall bus receiver. Although some shift in DC output will result over the operating temperature range due to the uncancelled Vbe for the diodes, this is not significant as the output will be AC coupled in audio bus receiver applications.

As previously stated, the common base amplifier transistor Q8 functions as a "current mirror amplifier" to reflect the signal current from the collector of the input transistor Q7 back to ground through the load resistor R14. As explained, an alternative is to use a current mirror amplifier. For either case, the purpose of the second stage of the differential amplifier is to develop a voltage across the load resistor R14 (and capacitor C2) relative to ground. This is desirable to avoid introducing power supply voltage dependence on the output and thus maintain good power supply rejection. The AC voltage gain at the collector of transistor Q8 is approximately equal to the ratio of resistors R14/R5. The capacitor C2 is provided to deliberately produce some degree of low pass function to reduce the susceptibility of following circuits to small amounts of RF and video that might be picked up on the bus.

Transistor Q9 is required only to provide a relatively low output impedance. If the load impedance is relatively high so as to not affect the gain or response as set by resistor R14 and Capacitor C2, then transistor Q9 and resistor R15 may be eliminated and the output may be taken across resistor R14. It might also be noted that there may be some applications where it is desirable to take the output of transistor Q8 (FIG. 1) or Q10 (FIG. 2) as a signal current and remotely sense the output voltage across resistor R14 and capacitor C2 by locating R14 and C2 remotely for the purpose of reducing internal ground potential problems in a specific application.

What is claimed is:

1. Differential to single-ended audio bus receiver apparatus, comprising:

a pair of bipolar transistors, each having a base electrode coupled via a respective input resistor to a respective bus receiver input terminal, each having an emitter electrode that is diode coupled to a respective current source and each having a collector electrode coupled via a respective load resistor to a source of reference potential; and wherein said emitter electrodes are coupled together via a gain control resistor and said collector electrodes are coupled to an output terminal via a differential amplifier having a single-ended output stage.

2. Apparatus as recited in claim 1 further comprising:

at least one DC offsetting means coupled to one of said collector load resistors.

3. Apparatus as recited in claim 2 wherein said differential amplifier includes a third bipolar transistor having emitter and base electrodes connected to respective ones of said collector electrodes of said pair of transistors and having a collector electrode for developing a single ended output signal.

4. Apparatus as recited in claim 3 wherein said differential amplifier further comprises a current mirror amplifier for coupling said single ended output signal to said output terminal.

5. Apparatus as recited in claim 3 wherein said differential amplifier further comprises a common base amplifier for coupling said single ended output signal to said output terminal.

6. Differential to single-ended audio bus receiver apparatus, comprising:

a pair of PNP transistors, each having a base electrode coupled via a respective input resistor to a respective bus receiver input terminal, each having an emitter electrode that is coupled via a respective PN diode and a respective constant current source to a source of positive supply voltage, and each having a collector electrode coupled via a respective load resistor to a source of reference potential; and wherein said emitter electrodes being coupled together via a gain control resistor and said collector electrodes being coupled to an output terminal via a differential amplifier having a single-ended output stage.

7. Apparatus as recited in claim 6 further comprising:

at least one semiconductor diode connected in series with a selected one of said collector load resistors for producing a DC offset voltage between said collector load resistors.

8. Apparatus as recited in claim 7 wherein said differential amplifier includes an NPN transistor having emitter and base electrodes connected to respective ones of said collector electrodes of said PNP transistors and having a collector electrode coupled via a current mirror amplifier to a load resistor for developing a single ended output signal voltage.

9. Apparatus as recited in claim 7 wherein said differential amplifier includes an NPN transistor having emitter and base electrodes connected to respective ones of said collector electrodes of said PNP transistors and having a collector electrode coupled via a common base amplifier amplifier to a load resistor for developing a single ended output signal voltage.

10. Apparatus as recited in claim 7 wherein said differential amplifier further comprises:

an emitter follower output stage; and a common base amplifier or a current mirror amplifier stage for coupling said collector electrode of said NPN bipolar transistor to an input of said emitter follower output stage.

11. Differential to single-ended audio bus receiver apparatus, comprising:

first and second PNP transistors;

first and second resistors connected between respective first and second input terminals and respective base electrodes of said first and second PNP transistors;

first and second constant current sources having respective outputs coupled to respective emitter electrodes of said first and second PNP transistors;

first and second collector load resistors coupled between respective collector electrodes of said first and second PNP transistors and a source of reference potential;

an emitter load resistor coupled between said emitter electrodes of said PNP transistors; and a differential amplifier comprising a single NPN transistor having first and second inputs connected to respective ones of said collector electrodes and having an output for providing a single-ended output signal.

12. Apparatus as recited in claim 11 further comprising:

DC offsetting means coupled to an input of said differential amplifier.

13. Apparatus as recited in claim 12 wherein said differential amplifier includes said NPN transistor having an emitter electrode connected to the collector electrode of one of said first and second PNP transistors, having a base electrode connected the collector electrode of the other of said first and second PNP transistors and having a collector electrode for providing a single ended output signal.

14. Apparatus as recited in claim 13 wherein said differential amplifier further comprises:

an emitter follower output stage; and a selected one of (i) a common base amplifier stage and (ii) a current mirror amplifier stage for coupling said collector electrode of said NPN transistor to a load resistor.

15. Differential to single-ended bus receiver apparatus, comprising:

a first PNP transistor having a base electrode coupled to a first input terminal via a first input resistor, having an emitter electrode coupled to a first current source and having a collector electrode coupled to a source of reference potential via a first collector load resistor;

a second PNP transistor having a base electrode coupled to a second input terminal via a second input resistor, having an emitter electrode coupled to a second current source and having a collector electrode coupled to said source of reference potential via a second collector load resistor;

an emitter load resistor connected between said emitter electrodes of said PNP transistors;

an NPN transistor having emitter and base electrodes coupled to respective collector electrodes of said PNP transistors and having a collector electrode for providing a single-ended output signal; and a diode connected in series with a selected one of said collector load resistors.

16. Apparatus as recited in claim 15, further comprising:

a current mirror amplifier or a common base amplifier having an input connected to receive said single ended output signal and having an output coupled to a point of reference potential via an output resistor for developing a single-ended output voltage.

* * * * *